(12) United States Patent
Taniguchi et al.

(10) Patent No.: US 6,548,317 B2
(45) Date of Patent: Apr. 15, 2003

(54) PHOTOELECTRIC CONVERSION ELEMENT AND METHOD FOR MANUFACTURING THE SAME

(75) Inventors: Takehiro Taniguchi, Tokyo (JP); Hironobu Narui, Kanagawa (JP); Noriko Ueno, Kanagawa (JP); Nobukata Okano, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/925,574

(22) Filed: Aug. 9, 2001

(65) Prior Publication Data

US 2001/0049152 A1 Dec. 6, 2001

Related U.S. Application Data

(62) Division of application No. 09/306,183, filed on May 6, 1999, now Pat. No. 6,310,381.

(30) Foreign Application Priority Data

May 8, 1998 (JP) .......................................... 10-126527

(51) Int. Cl.[7] .............................................. H01L 21/00
(52) U.S. Cl. ............................ 438/25; 438/26; 438/39; 438/46
(58) Field of Search ............................. 438/25, 26, 31, 438/39, 46

(56) References Cited

U.S. PATENT DOCUMENTS

| | | | |
|---|---|---|---|
| 5,360,761 A | * 11/1994 | Andrews | 438/28 |
| 5,703,394 A | * 12/1997 | Wei et al. | 257/433 |
| 5,757,040 A | * 5/1998 | Saito et al. | 257/232 |
| 5,852,624 A | * 12/1998 | Matsuyama et al. | 372/44 |
| 5,977,571 A | * 11/1999 | Goossen | 257/184 |
| 6,023,339 A | * 2/2000 | Haugsjaa et al. | 356/401 |
| 6,081,020 A | * 6/2000 | Frahm et al. | 257/458 |

* cited by examiner

*Primary Examiner*—Trung Dang
(74) *Attorney, Agent, or Firm*—Sonnenschein, Nath & Rosenthal

(57) ABSTRACT

The purpose of the invention is to provide a photoelectric conversion element enable to ensure the connection of the contact electrode easily and accurately.

The plurality of the laser oscillator in which a semiconductor layer and the p-side electrode are laminated are formed on the same substrate. Each contact electrode formed on the base substrate through each opening of the insulating layer is electrically connected to each p-side electrode. Each opening corresponding to each laser oscillator placed side by side is formed in a staggered configuration in the alignment direction. Each contact electrode is extended in parallel with the alignment direction corresponding to each opening. Accordingly, the space between each opening and the space between each contact electrode which are placed side by side in the alignment direction are widened and the requirement for highly accurate position matching is eliminated. Therefore, each p-side electrode and each contact electrode can be connected easily and accurately.

15 Claims, 10 Drawing Sheets

PHOTOELECTRIC CONVERSION ELEMENT AND METHOD FOR MANUFACTURING THE SAME

STATEMENT OF CROSS RELATED APPLICATIONS

This application is a divisional application, and claims the benefit of the earlier filing date, of U.S. Ser. No. 09/306,183 (filed May 6, 1999) now U.S. Pat. No. 6,310,381 (now allowed), which claims priority to Japanese Application No. P10-126527, filed May 8, 1998; the disclosures of which are incorporated by reference herein to the extent permissible by law.

BACKGROUND OF THE INVENTION

1. Field of the Invention

The present invention relates to a photoelectric conversion element having a contact electrode for a photoelectric conversion portions and a method for manufacturing the same. More particularly, the invention relates to a photoelectric conversion element with the plurality of photoelectric conversion portions on the same substrate and a method of manufacturing the same.

2. Description of the Related Art

Today, different kinds of apparatuses such as an optical disc device, a laser beam printer, a duplicator using a laser diode, LD, have been developed. In recent years, more rapidity and higher performance are demanded for an operation provided by each of those devices. To satisfy such a demand, the use of the plurality of laser beams has been considered as one method. For example, simultaneous reading of the plurality of tracks by using the plurality of laser beams easily increase the reading speed in an optical disc device. Thus, the development of an LD, or a multi-beam laser, is demanded which can inject the plurality of laser beams simultaneously.

FIGS. 1 and 2 show the disassembled construction of a conventional. multi-beam laser. FIG. 1 shows a multi-beam laser with two laser beams. FIG. 2 shows a multi-beam laser with four laser beams. These multi-beam laser have the plurality of laser oscillators 110 on the same substrate 111. Each of those electrode 117 is electrically connected to each contact electrode 131 formed on a base 132 with each wiring 133 in between, respectively. Increase in the number of laser beams requires narrower space between each laser beam. For example, suppose the space between two laser beams is 60 $\mu$m. Then, if the number of laser beams are four, the space between each laser beam will be 20 $\mu$m. In this way, as the number of laser beams increases, the space $S_1$ between each laser oscillator 110 becomes narrower.

SUMMARY OF THE INVENTION

However, in a conventional multi-beam laser, each contact electrode 131 is connected to the whole surface of each electrode 117 on each laser oscillator 110, respectively. For that reason, when the number of the laser beams increases and the space $S_1$ between each laser oscillator 110 becomes narrower, extremely highly precise position matching has been required for those laser beams. That is, since each space between each electrode 117 and each contact electrode 131 are close, a small displacement of each contact electrode 131 makes one contact electrode 131 connect to the electrode 117 of two laser oscillators 110, respectively. Thus, each laser oscillator 110 can not be driven independently. Therefore, if the number of laser beams is increased to achieve more rapidity and higher performance, it causes difficulty in connecting each contact electrode 131 and each electrode 117 accurately. For that reason, mass production has been also difficult.

The present invention has been realized in view of such problems. It is an object of this invention to provide a photoelectric conversion element which can keep easy and accurate connection of contact electrode and a method for manufacturing the same.

The photoelectric conversion element comprises: a photoelectric conversion portion having a semiconductor layer equipped on a substrate and an electrode equipped on the semiconductor layer, a contact electrode electrically connected to the electrode of the photoelectric conversion portion, and an insulating layer formed between the contact electrode and the electrode of the photoelectric conversion portion and equipped with an opening for connecting them electrically.

The method for manufacturing the photoelectric conversion element according to this invention includes: forming a photoelectric conversion portion having a semiconductor layer equipped on a substrate and an electrode equipped on the semiconductor layer, forming an insulating layer having an opening for the electrode of the photoelectric conversion portion, and forming a contact electrode electrically connected to the electrode of the photoelectric conversion portion through the opening of the insulating layer.

In the photoelectric conversion element according to this invention, the electrode of the photoelectric conversion portion and the contact electrode are electrically connected through the opening of the insulating layer. Thus, high precision is not required for the position matching of the electrode and the contact electrode, being connected easily and accurately.

In the method for manufacturing the photoelectric conversion element according to this invention, the photoelectric conversion portion having the semiconductor layer equipped on the substrate and the electrode is formed first. Then, the insulating layer with the opening for this electrode is formed. Following that, the contact electrode is formed which is electrically connected to the electrode of the photoelectric portion through the opening of this insulating layer.

DETAILED DESCRIPTION OF THE PREFERRED EMBODIMENTS

The embodiments of this invention will be described in detail with reference to the accompanying drawings.

Figure 1:
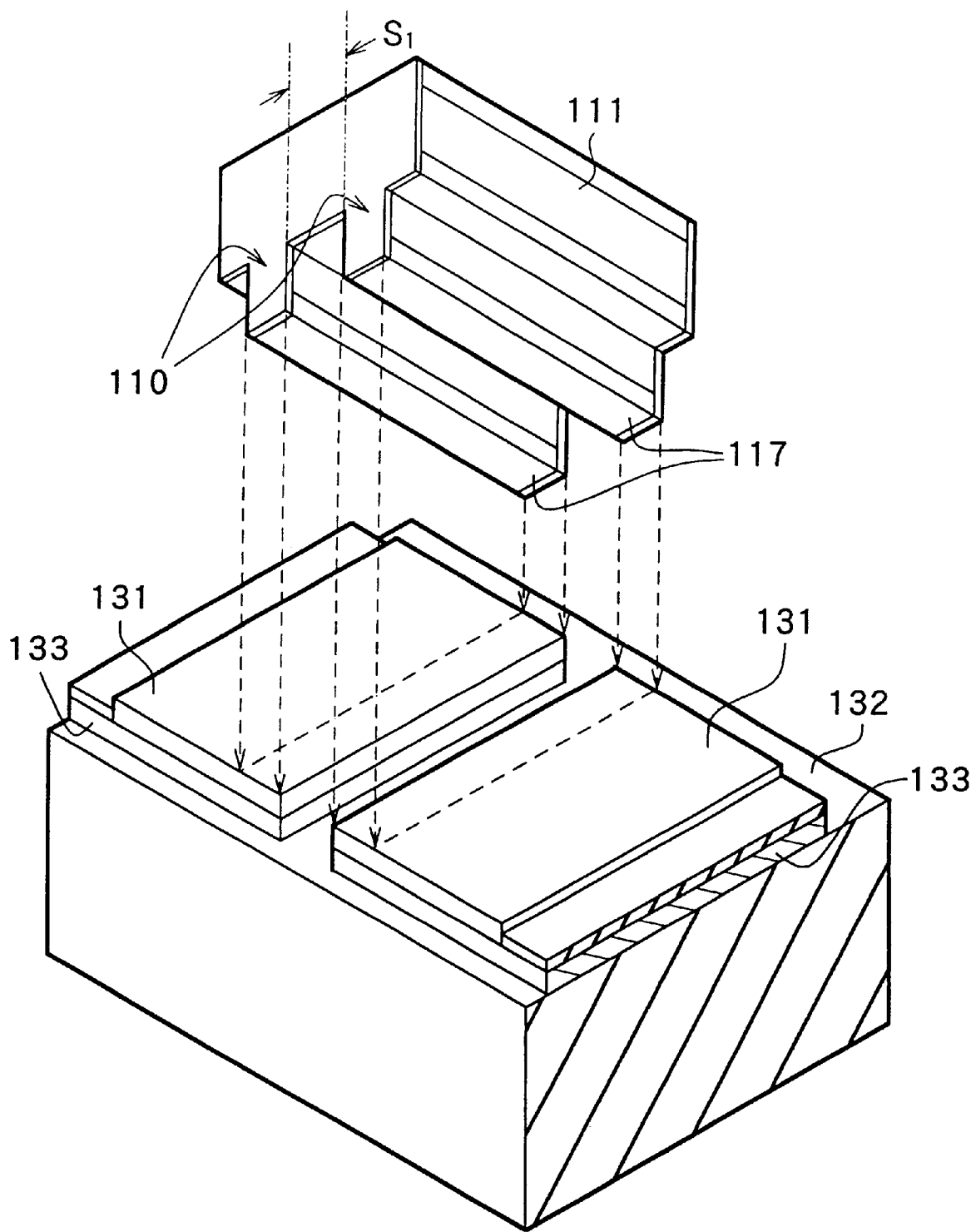
FIG. 1 is a perspective view showing a disassembled structure of the conventional multi-beam laser.
Figure 2:
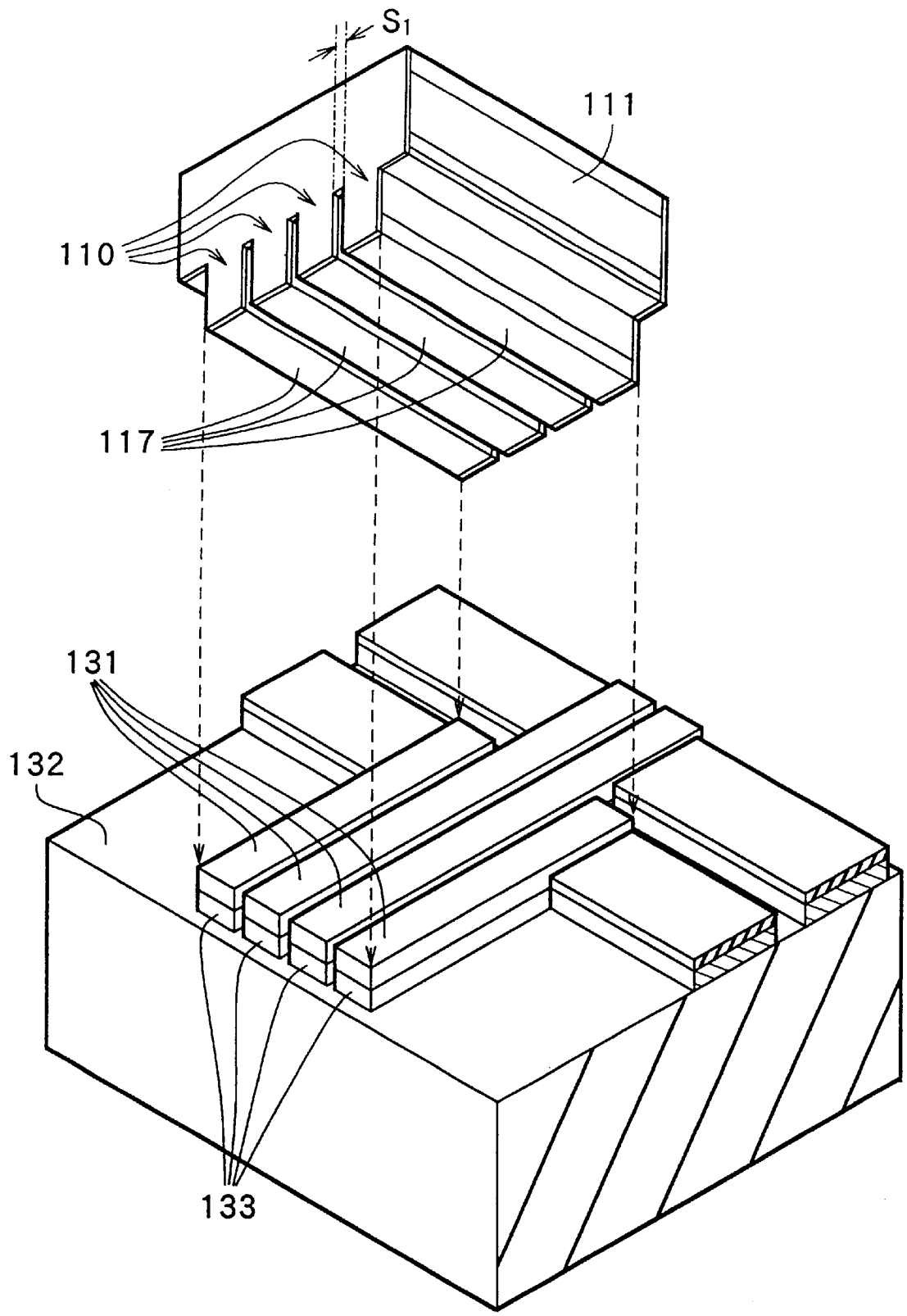
FIG. 2 is a perspective view showing a disassembled structure of the other conventional multi-beam laser.
Figure 3:
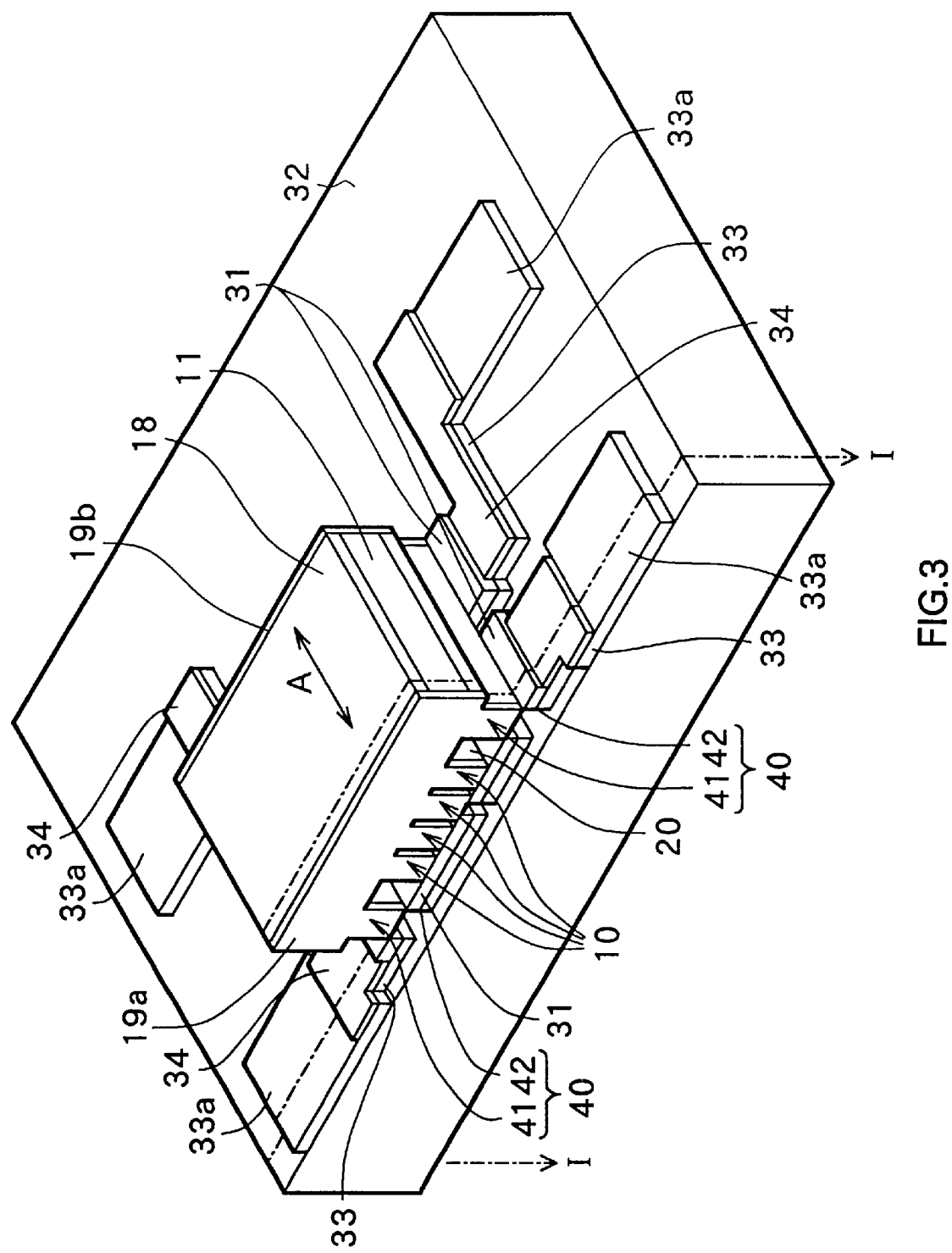
FIG. 3 is a perspective view showing a structure of a laser diode of one embodiment of the invention.
Figure 4:
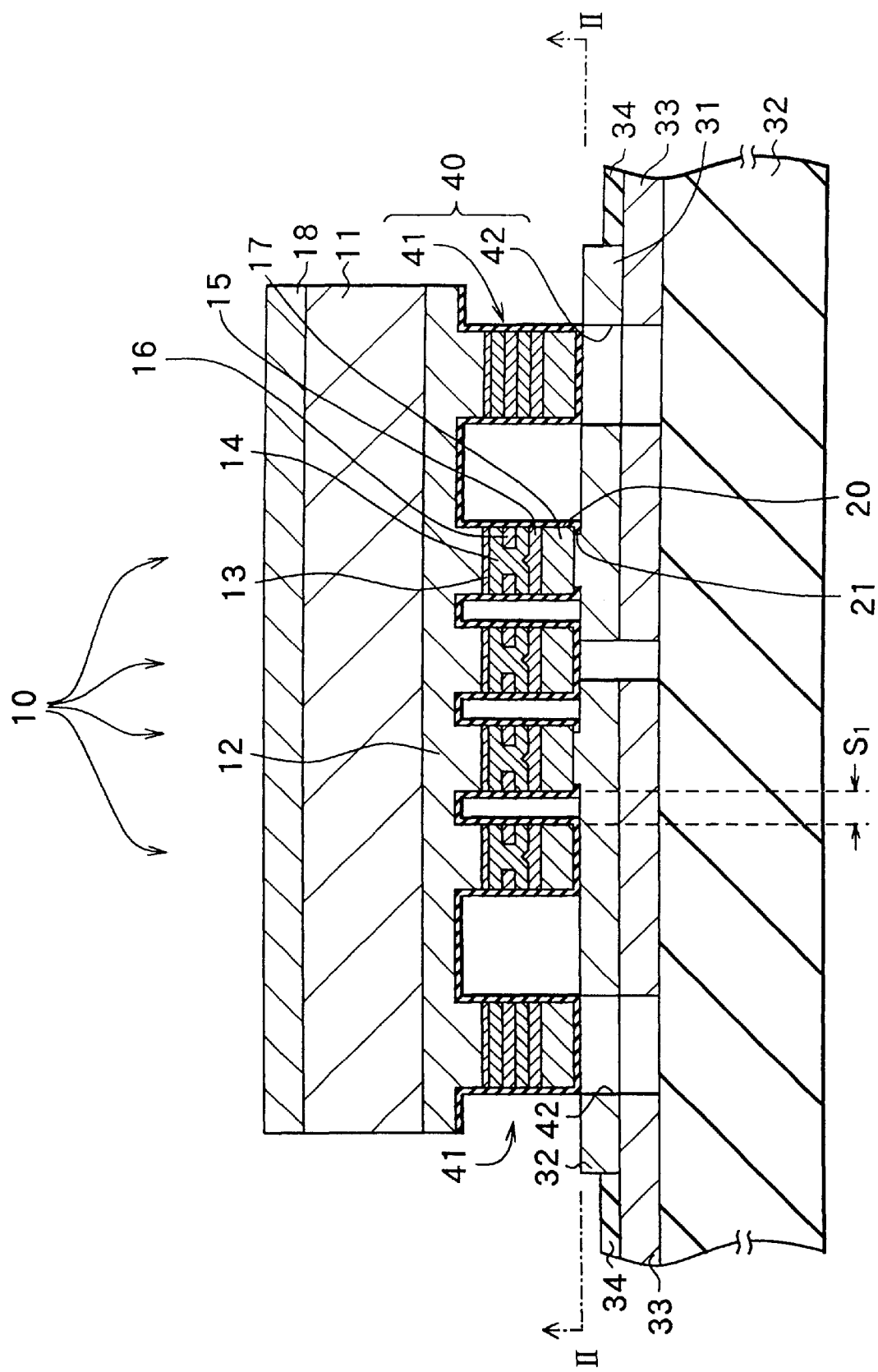
FIG. 4 is a cross sectional view taken on line I—I of the laser diode shown in FIG. 3.
Figure 5:
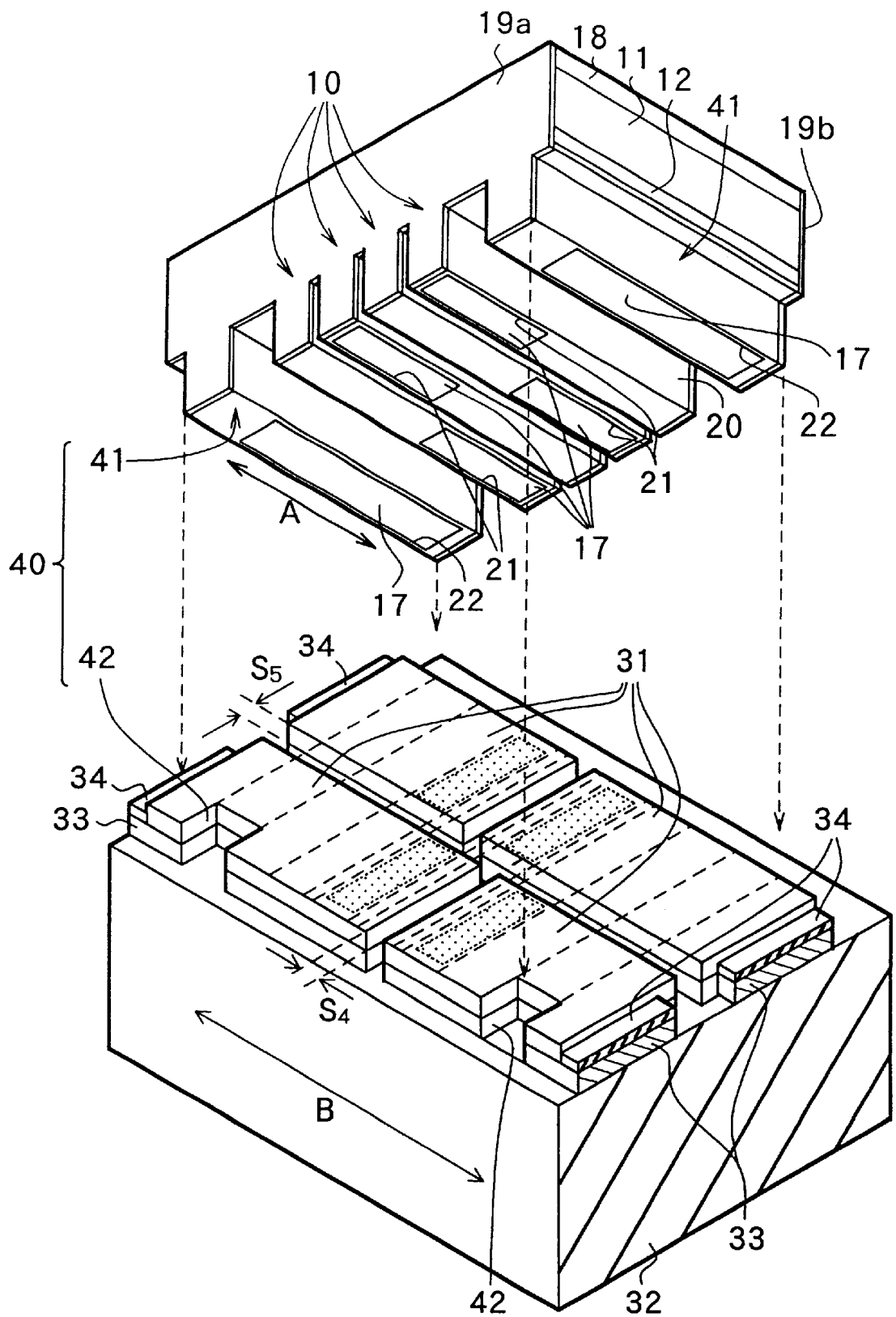
FIG. 5 is a perspective view showing the laser diode of FIG. 3 partly disassembled along the line II—II.

FIG. 3 shows a whole structure of a laser diode that is a photo electric conversion element according to one embodiment of the invention. FIG. 4 shows a sectional structure taken on line II—II of FIG. 3. FIG. 5 shows a structure disassembled along the line II—II of FIG. 2. Here, a photoelectric conversion element refers to an element that converts optical energy and electric energy. This photoelectric conversion element converts optical energy to electric energy and vise versa.

As shown in FIG. 3, this laser diode has the plurality (4 in FIG. 3) of laser oscillator 10 as a photoelectric conversion portion deployed vertically to the resonator direction A. Each laser oscillator 10 may have the same structure each other. As shown in FIG. 4, n-type clad layer 12, active layer 13, p-type clad layer 14 and cap layer 15 are laminated successively on one surface, a surface (100), of the successive, same substrate 11. The size of each laser oscillator 10 may have the resonator direction A with 350 $\mu$m in length and with 12 $\mu$m in width in the vertical direction. A space $S_1$ between each laser oscillator 10 is, for example, 3 $\mu$m.

A substrate 11 is composed of n-type GaAs with silicon, Si, or selenium, Se, as a n-type impurity for example. Each n-type clad layer 12 is composed of n-type AlGaAs mixed crystal with silicon or selenium as a n-type impurity, for example. The composition ratio in a class III chemical element of this n-type AlGaAs mixed crystal is, for example, 45% aluminum, Al, and 55% gallium (%: mole %.) Each active layer 13 is composed of, for example, i-AlGaAs mixed crystal without impurities ('i-' refers to no impurities.) The composition ratio in a class III chemical element of this n-type AlGaAs mixed crystal is, for example, 14% aluminum, Al, and 86% gallium. Each p-type clad layer 14 is composed of, for example, p-type AlGaAs mixed crystal with zinc, Zn, as a impurity. The composition ratio in a class III chemical element of this p-type AlGaAs mixed crystal is, for example, 45% aluminum and 55% gallium. Each cap layer 15 is composed of, for example, p-type AlGaAs mixed crystal with zinc as a p-type impurity.

Each p-type clad layer 14 has current block layers 16 inserted in both sides along the resonator direction A which is vertical to the surface of paper in FIG. 4 in part of the laminated layer direction. That is, each p-type clad layer 14 becomes narrower in width in the resonator direction A and in the vertical direction constructing a current narrowing portion. Each of these current block layers 16 is composed of, for example, n-type GaAs with silicon or selenium as a n-type impurity.

Each laser oscillator 10 also has each p-side electrode 17 at the opposite side of the p-type clad layer 14 of each cap layer 15, respectively, while the other surface opposing to one surface of the substrate 11 has an n-side electrode 18, respectively. Each p-side electrode 17 has an alloy composition made by laminating a titanium (Ti) layer, a platinum (Pt) layer and a gold (Au) layer, for example, successively from the side of the cap layer 15 and heat is added thereon to be connected electrically to each cap layer 15. An n-side electrode 18 has an alloy composition made by laminating an alloy layer consisting of gold and germanium (Ge), a nickel (Ni) layer, and a gold (Au) layer, for example, successively from the side of the substrate 11 and heat is added thereon to be connected electrically to the substrate 11.

Furthermore, each laser oscillator 10, as shown in FIG. 3, has a pair of facing films 19a and 19b, respectively, which are placed successively each other on a pair of sides vertical to the resonator direction A. One facing film 19a is composed of oxide aluminum ($Al_2O_3$), for example, and has a low reflection factor. Another facing film 19b is composed by laminating an oxide aluminum layer and an amorphous silicon layer alternately, for example, and has a high reflection factor. In other words, light occurred in each active layer 13 is amplified by traveling between a pair of facing films 19a and 19b to be injected as a laser beam from the facing film 19a respectively.

As shown in FIG. 5, a mutually successive insulating layer 20 which is composed of an insulating material such as nitriding silicon ($Si_3N_4$) is formed so as to cover each p-side electrode 17 on each laser oscillator 10. That is, this insulating layer 20 covers a pair of sides parallel with the resonator direction A of each of the laser oscillator 10, i.e. sides of each semiconductor layer and each p-side electrode 17, and the surface between each laser oscillator 10, respectively. The thickness of this insulating layer 20 is, for example, 0.15 $\mu$m and has the plurality of openings 21 corresponding to each p-side electrode 17. Each opening 21 exposes about half of one side in the resonator direction A among each p-side electrode 17 and is placed alternately not to be side by side in the arrangement direction B which is vertical to the resonator direction A between each laser oscillator 10 mutually placed side by side.

Figure 6:
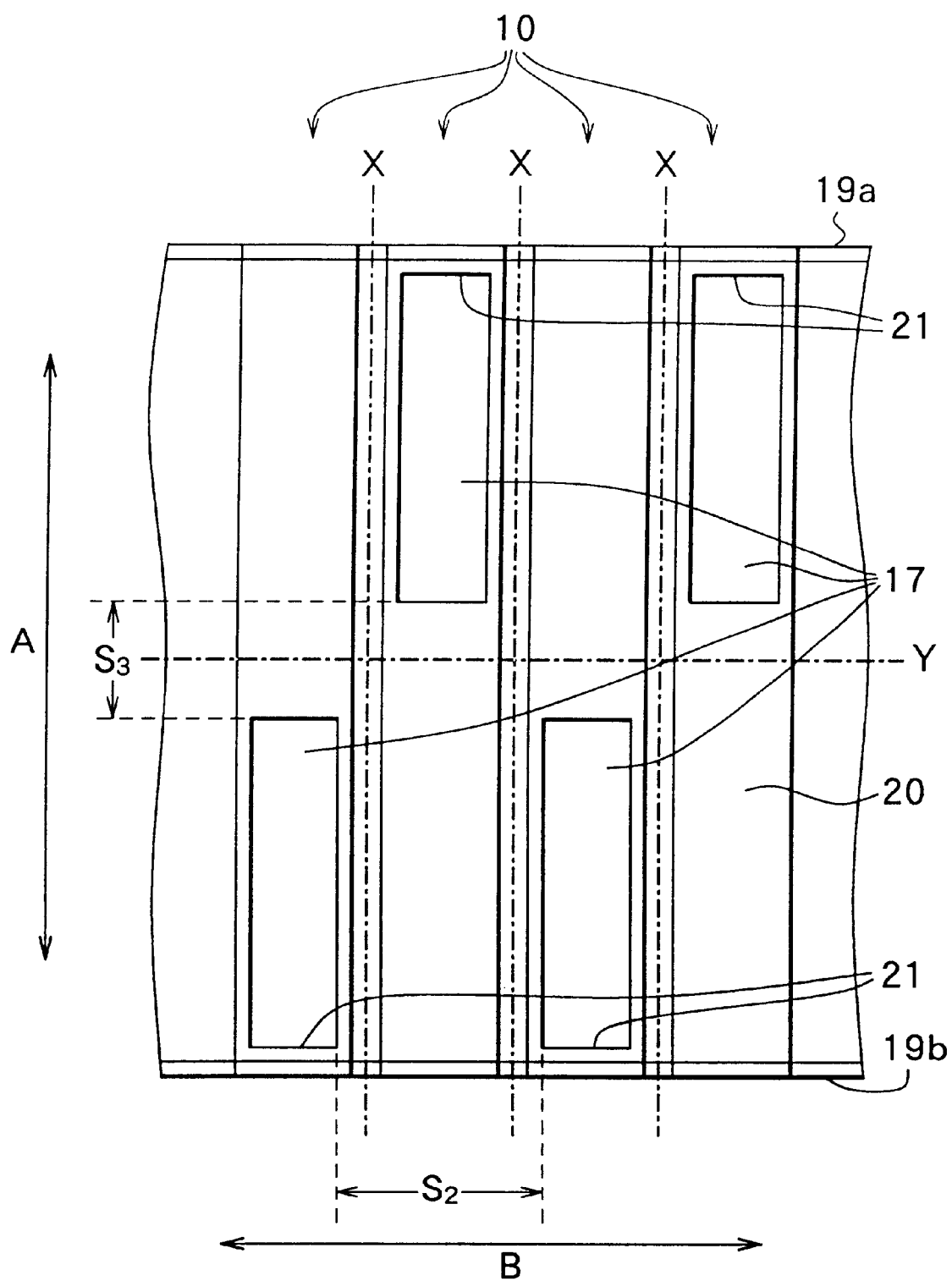
FIG. 6 is a cross sectional view taken on line II—II of the laser diode shown in FIG. 3.

Now, the position relationship of each opening 21 will be described further by making reference to FIG. 6. FIG. 6 shows a sectional structure near a laser oscillator 10 taken on line II—II of FIG. 4. For example, on the surface parallel to the substrate 11 each area is divided in a grid by each line X drawn between each laser oscillator 10 in parallel with the resonator direction A and by each line Y drawn in the center of each laser oscillator 10 vertically to the resonator direction A. Each opening 21 is placed within each area which aligns in a slanting direction or aligns longitudinally or laterally with more than one area of space between the areas the openings are positioned. In other words, each opening 21 corresponding to each laser oscillator 10 placed side by side is placed within each area placed in a mutually slanting direction. Thus, as the space $S_2$ between each opening 21 placed side by side in the alignment direction B has one laser oscillator 10 between each other, the space $S_2$ is opened wide enough as much as about 18 $\mu$m. Also, the space $S_3$ between each opening 21 in the resonator direction A is opened widely enough as much as about 18 $\mu$m in view of a displacement while manufacturing.

As shown in FIG. 5, each of the contact electrode 31 is electrically connected to the p-side electrode 17 in each laser oscillator 10 through each opening 21, respectively. In FIG. 5, broken lines indicate each position where the insulating layer is in a contact with each contact electrode 31, and dotted areas indicate each position where each opening 21 is in a contact with. Thus, each contact electrode 31 extends from the center of laser oscillator 10 to the outside in parallel with the alignment direction B corresponding to each opening 21, respectively. In other words, each contact electrode 31 corresponding to each laser oscillator 10 placed in one side off the center of the alignment direction B is extended toward the one side while each contact electrode corresponding to each laser oscillator 10 in the other side is extended toward the other side. It is preferable to form each contact electrode 31 by extending from the position corresponding to each opening 21 because it widens a contact area with a wire 33 and lowers its resistance. The space $S_4$ between each contact electrode 31 in the alignment direction B and the space $S_5$ in the resonator direction A are opened widely enough, respectively, matching each position of the openings 21.

Each contact electrode 31 is formed on one surface of a base substrate 32 through each wire 33 and constructed by sequentially laminating a platinum layer and a soldered layer (an alloy layer of Pb and Sn), for example from the side of the base 32. The base 32 is constructed by aluminum nitride (AIN), for example. Each wire 33 is constructed by sequentially laminating a titan layer, a platinum layer and a gold layer from the side of the base substrate 32. An insulating film 34 consists of aluminum nitride is formed on the surface of each wiring 33 except on wire pad 33 a, for connecting wires.

As is shown in FIG. 5, the semiconductor laser according to this embodiment is further equipped with a position matching portion 40 for connecting each p-side electrode 17 and each contact electrode 31 on each laser oscillator 10. The position matching portion 40 has two substrate side position matching portions 41 formed on one surface of the substrate 11 and two base substrate side position matching portion 42 formed on one surface of the base substrate 32.

Each substrate side position matching portion 41 has a form of protrusion with extended parallely with the resonator direction A and is placed to catch each laser oscillator 10, respectively. Each substrate side position matching 41 has almost the same internal construction as the one of each laser oscillator 10 except that a current block layes is equipped all over in the p-type clad layer, and each surface is constructed by the insulating film 20, respectively. In other words, the opposite side of substrate 11 according to each of the substrate side position matching portion 41 is fixed in a contact with each contact electrode 31, respectively. Thus, the substrate side position matching portion 41 can support the connection of each p-side electrode 17 and each contact electrode 31 on each laser oscillator 10 and, furthermore, support each laser oscillator 10 supplementary. Also, the insulating film 20 constructing the surface of each side position matching portion 41 has each opening 22 on at least a part of the opposing surface to each contact electrode 31. By jointing each p-side electrode 17 as a metallic layer formed inside of each substrate side position matching portion 41 with each contact electrode 31, respectively, the junction of each laser oscillator 10 and each contact electrode 31 can be supported more strongly.

Each base substrate side position matching portion 42 is constructed with two dents formed by rectangularly removing part of sides of the contact electrode 31 and the wiring 33, respectively, corresponding to each substrate side position matching portion 41.

A semiconductor laser with such a construction is manufactured by following.

From FIG. 7A–7C to FIG. 8A, 8B show each manufacturing process. Each drawings are section views taken on line I—I of FIG. 3. First, as shown in FIG. 7 A, prepare the substrate 11 consisting of n-type GaAs mix crystal, for example. By following the method of Metal Organic Chemical Vapor Deposition, MOCVD, raise the n-type clad layer 12 consisting of n-type AlGaAs mix crystal, the active layer 13 consisting of I-AlGaAs mix crystal and the p-type clad layer 14 consisting of I-AlGaAs mix crystal sequentially on the side of one surface (100 surface) of the substrate 11.

Figure 7A:
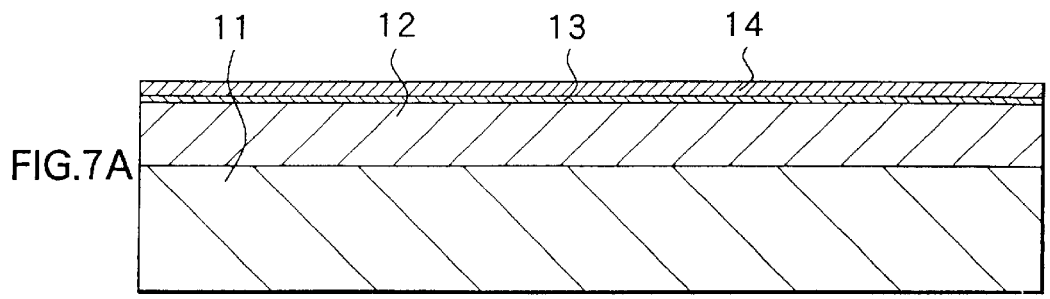
FIG. 7A, 7B, 7C are a cross sectional view taken on line I—I showing each manufacturing process of the laser diode of FIG. 3.
Figure 7B:
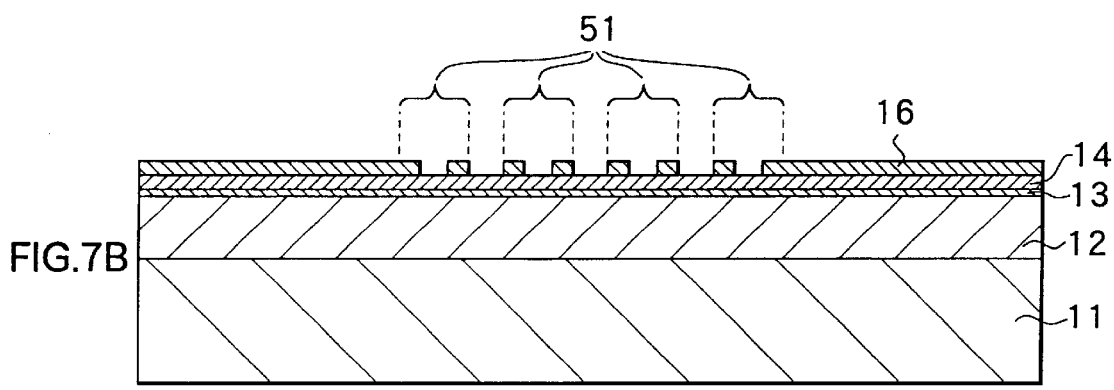

Next, as shown in FIG. 7B, by following the MOCVD method, for example, raise the current block layer 16 consisting of n-type GaAs on the p-type clad layer 14. Then, by following the Reactive Ion Etching, RIE, method, for example, remove this current block layer 16 selectively according to a laser oscillator forming area 51 to shape it in a predetermined form. Though the plurality of semiconductor laser forming areas exist on one surface of the substrate 11, only one semiconductor laser forming area is shown in each flow diagram shown in FIGS. 7–9.

Figure 7C:
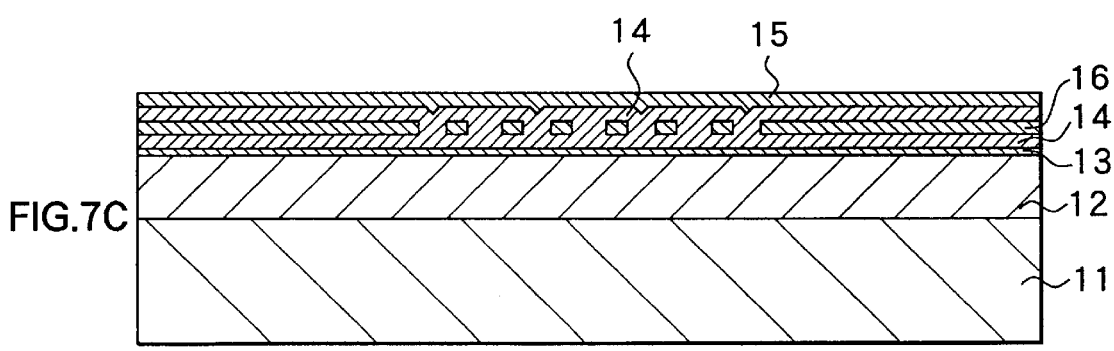

As shown in FIG. 7C, after shaping the current block layer 16, by following the MOCVD method, for example, raise a part of the p-type clad layer 14 consisting of p-type Al GaAs mix crystal and the cap layer 15 consisting of p-type GaAs sequentially on the current block layer 16 and p-type clad layer 14. Then, in order to achieve ohmic contact between the cap layer 15 and the p-side electrode 17 thereon, diffuse zinc into the cap layer 15.

Figure 8A:
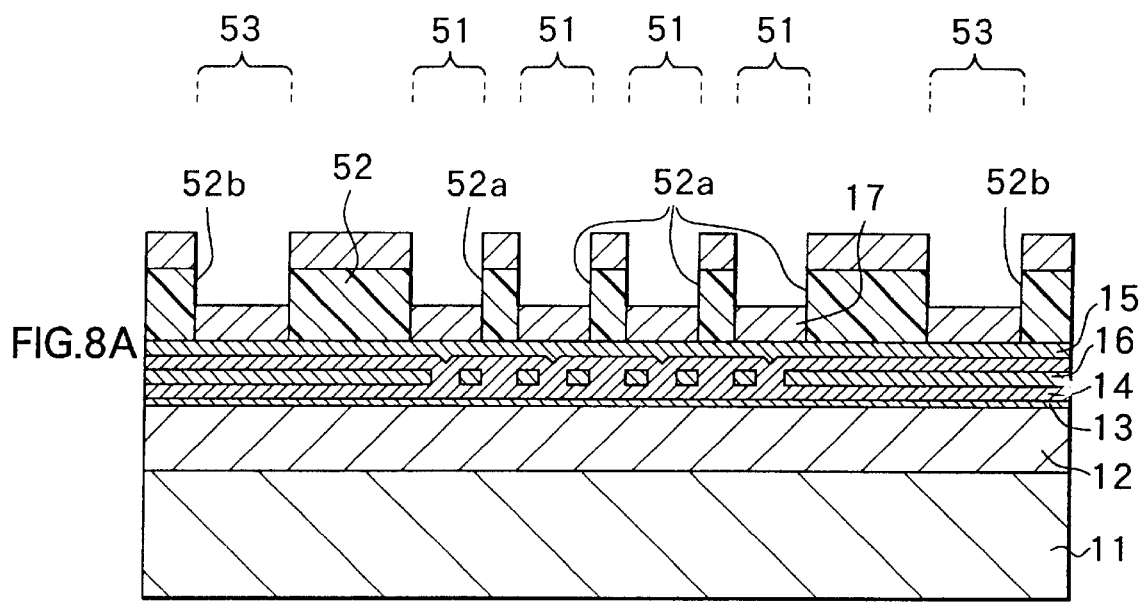
FIG. 8A, 8B are a cross sectional view taken on line I—I showing each manufacturing process following FIG. 7.

After diffusing zinc, as shown in FIG. 8A, apply and form a photo-resist film 52 on the cap layer 15 to form each opening 52a and 52b corresponding to each laser oscillator forming area 51 and each position matching portion forming area 53. Then, evaporate a titan layer, a platinum layer and a gold layer, for example, on to the photo-resist film 52 and the cap layer 15 sequentially to form the p-side electrode 17. Next, remove the p-side electrode 17 formed on the photo-resist film 52 along with the photo-resist film 52. Thus, each p-side electrode 17 remains in order to correspond to only each laser oscillator forming area 51 and each position matching portion forming area 53, respectively.

Figure 8B:
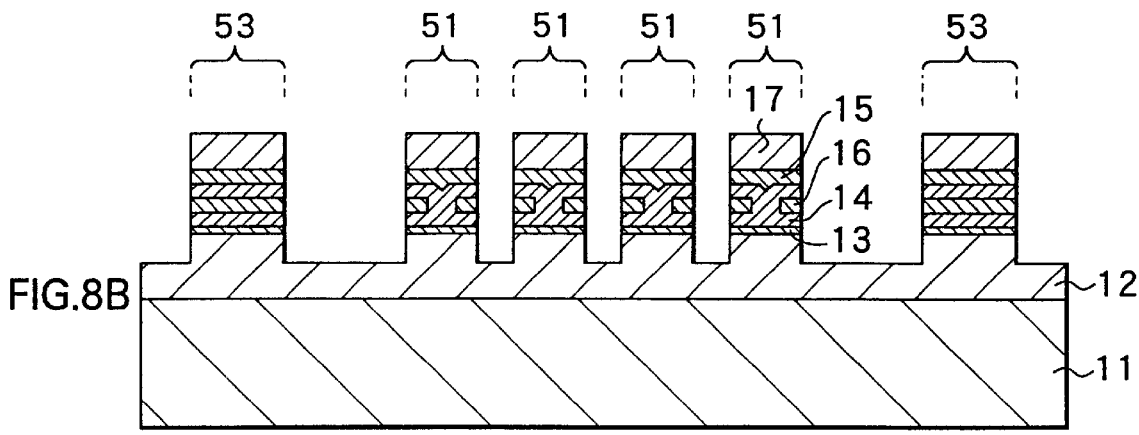

After respectively forming each p-side electrode 17, as shown in FIG. 8B, by following the RIE method, remove selectively part of the cap layer 15, the p-type clad layer 14, the current block layer 16, the active layer 13 and the n-type clad layer 12, respectively using each p-side electrode 17 as a mask. Accordingly the active layer 13, the p-type clad layer 14, and the cap layer 15 are separated respectively according to each laser oscillator forming area 51 and each position matching portion forming area 53. This separation is done using each p-side electrode 17 as a mask directly, so a lithography process is not required and precise separation can be achieved with fewer process. However, without using each p-side electrode 17 as a mask, it is possible to form a resist film on each p-side electrode 17 through a lithography process selectively and etch the resist film used as a mask by following the RIE method to separate them.

Figure 9A:
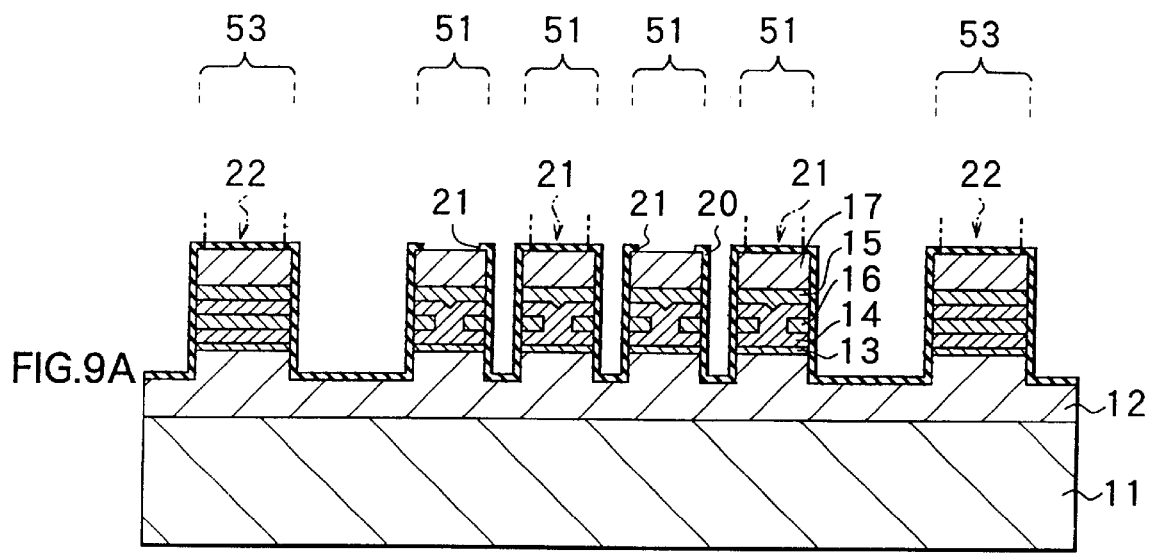
FIG. 9 is a cross sectional view taken on line I—I showing each manufacturing process following FIG. 8.

After separating them, as shown in FIG. 9A, by following the Chemical Vapor Deposition, CVD, method, for example, form the insulating layer 20 on the whole surface of one side of the substrate 11 including the p-side electrode 17. Then, remove the insulating film 20 selectively by etching to form each opening 21 corresponding to each laser oscillator forming area 51, while forming each opening 22 corresponding to each position matching portion forming area, 53, respectively. Be sure to form them within each area that is divided in a grid and aligned in a slanting direction or aligns longitudinally or laterally with more than one area of space between the areas each opening is formed. In FIG. 9A, each opening 22 is not shown in the section view, so the position in the sectional direction is shown in broken lines. Each opening 21 not shown in the sectional view is also shown in broken lines.

Figure 9B:
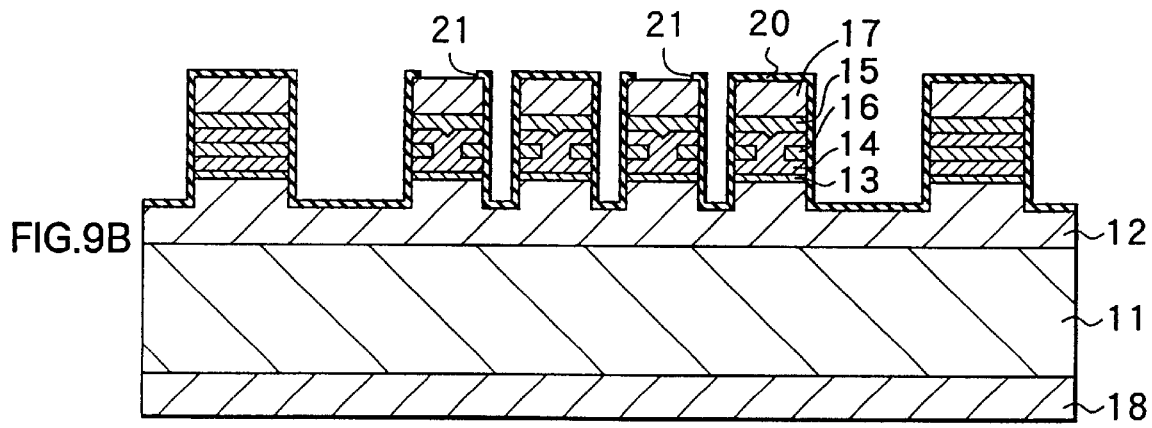

After forming each opening 21 and 22 on the insulating layer 20, respectively, wrap the other surface side of the substrate 11 so that the thickness of the substrate 11 becomes 100 $\mu$m. This permits easy cleaver of the substrate 11, which is done in a process described later. After wrapping the substrate 11, as shown in FIG. 9B, evaporate an alloy layer of gold and germanium, a nickel layer and a gold layer onto the other surface side of the substrate 11 to form an n-side electrode 18. Then, apply heat processing to alloy each p-side electrode 17 and n-side electrode 18, respectively.

After applying heat processing, though it is not shown in figures, cleavage the substrate 11 making correspondence to one semiconductor laser forming area in the resonator direction A and in the vertical direction, respectively. Then, form an edge face film 19a and 19b for a pair of sides perpendicular to the resonator direction A according to , for example, the CVD method, respectively.

Furthermore, though it is not shown, aside from each laser oscillator 10, prepare the base substrate 32 consisting of aluminum nitride, for example. Selectively evaporate a titan layer, a platinum layer and gold layer sequentially on to the one surface side to form each wiring 33, respectively, making correspondence to each opening 21 of the insulating layer 20. At that time, form each wiring 33 so as to by extend toward the outside of each oscillator in parallel with the alignment direction B from the position corresponding to each opening 20, respectively. Also, form each base substrate position matching portion 42 consisting of rectangularly dented portion corresponding to each substrate side position matching portion 41 on part of the side of each wiring 33, respectively.

Next, sequentially evaporate a platinum layer and a soldered layer onto each wiring 33, selectively, to form each contact electrode 31 making correspondence to each opening 21 of the insulating layer 20, respectively. At that time, form each contact electrode 31 so as to extend toward the outside of each oscillator in parallel with the alignment direction B from the position corresponding to each opening 20, respectively. Also, form each base position matching portion 42 consisting of rectangularly dented portion corresponding to each wiring 33 that matches to each substrate side position matching portion 41 on part of the side of each contact electrode 31, respectively. Then, according to CVD method for example, form the insulating film consisting of aluminum nitride on each wiring 33 except on wire pad 33a, respectively.

Figure 10:
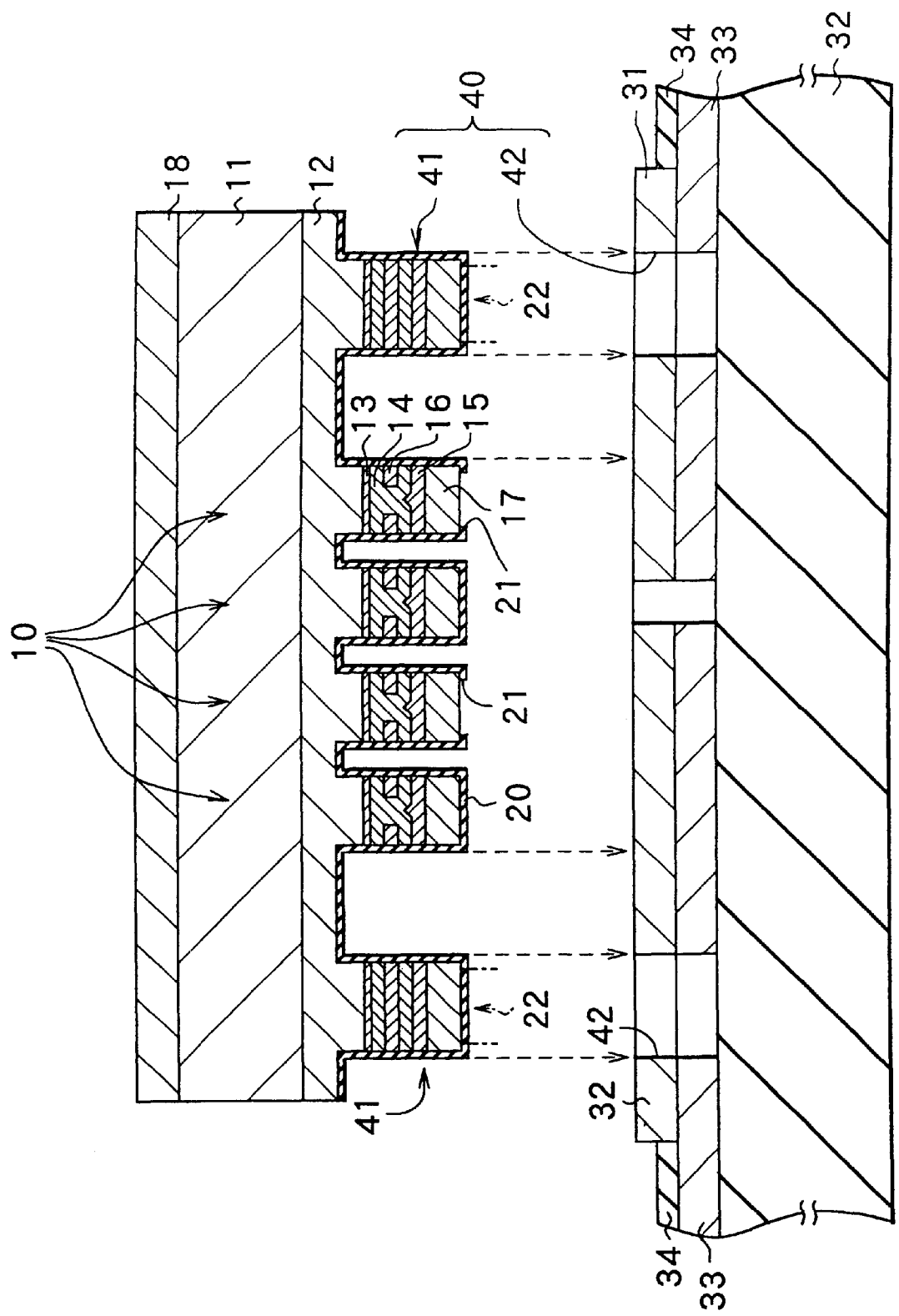
FIG. 10 is a cross sectional view taken on line I—I showing a manufacturing process following FIG. 9.

Thus, after forming each laser oscillator 10 and each contact electrode 31, respectively, as shown in FIG. 10, make each oscillator 10 contact with each contact electrode 31. At that time, match each base side position matching portion 42 formed on base 32 and each substrate side position matching portion 41 each other. Hereby, easy and accurate position matching, is performed.

Then, apply heat processing and connect each contact electrode 31 and each p-side electrode 17 of each laser oscillator 10 electrically through each opening 21 on the insulating film 20 formed between them. Here, the space $S_2$ and $S_3$ between each opening 21 on the insulating layer 20 and the space $S_4$ and $S_5$ between each contact electrode 31 are formed widely enough. Therefore, the high accuracy for their position matching is not required, and mutually corresponding each p-side electrode 17 and each contact electrode 31 can be connected easily and accurately. Also, heat processing allows each p-side electrode 17 of each substrate side position matching portion 41 to be jointed with each contact electrode 31 through each opening 22, respectively. Therefore, the joint between each laser oscillator 10 and each contact electrode 31 can be supported more strongly. Accordingly, the semiconductor laser shown in FIG. 3 is formed.

The operation of the semiconductor laser manufactured as described above will be described in the following.

A predetermined voltage is applied to between each p-side electrode 17 and n-side electrode 18 through each contact electrode 31 at the point of the power-on to each wire pad portion 33a of each wiring 33 and each n-side electrode 18 of each laser oscillator 10. This permits current injection into each active layer 13 in each laser oscillator 10 and light emission occurs due to electron-hole recombination, respectively. Those light rays travel between a pair of the edge face films 19a and 19b to be amplified and rejected from the edge face film 19a to the outside. Here, each contact electrode 31 and each p-side electrode 17 are connected through each opening 21 of the insulating layer 20, respectively. Also, the space $S_2$, $S_3$, $S_4$ and $S_5$ between each opening 21 and each contact electrode 31 are formed widely enough. So, it does not require high accuracy for their positioning, and each of them is connected easily and accurately. It allows mutually independent drive for each laser oscillator 10.

According to this embodiment, each contact electrode 31 and each p-side electrode 17 are connected through each opening 21 of the insulating layer 20, respectively. While, each opening 21 is placed within each area of the gird-divided area on the surface parallel to the substrate 11 which aligns in a slanting direction or aligns longitudinally or laterally with more than one area of space in between the areas each opening is positioned. Therefore, it does not require highly accurate position matching between each contact electrode 31 and each p-side electrode 17. Accordingly, it does not require high accuracy for their positioning, and each of them is connected easily and accurately. It allows mutually independent drive of each oscillator 10 and mass production of the laser diode.

According to this embodiment, the substrate side position matching portion 41 is equipped on the substrate 11, while the base side position matching portion 42 is equipped on the base 32, corresponding to the substrate side position matching portion 41. By using the substrate side position matching portion 41 and the base side position matching portion 42, the position of each contact electrode 31 and each laser oscillator 10 are matched easily and accurately. Thus, each of contact electrodes 31 and p-side electrodes 17 are connected easily and accurately.

Furthermore, according to this embodiment, each substrate side position matching portion 41 is protruded and fixed to each contact electrode 31. Thus, it can support the junction of each laser oscillator 10 and each contact electrode 31, and, furthermore, support each laser oscillator 10.

In addition, according to this embodiment, each substrate side position matching portion 41 is constructed almost as same construction as each laser oscillator 10 to form each p-side electrode 17, while each opening 22 is formed to be opposed to each contact electrode 31 on the insulating film 20. The joint between each p-side electrode 17 of each substrate side position matching portion 41 and each contact electrode 31 allows stronger joint between each laser oscillator 10 and each contact electrode 31.

Still further, according to the manufacturing method of the semiconductor laser according to this embodiment, when separating the active layer 13, the p-type clad layer 14, the cap layer 15 and the like accumulated on the substrate 11 according to each laser oscillator forming area 51, each p-side electrode 17 is etched as a mask. This permits highly accurate separation with less process and achieves simpler manufacturing steps and lower manufacturing costs. Also, it eliminates displacement between each p-side electrode 17 and each cap layer 15. This enhance accuracy of position matching between each contact electrode 31 and each laser oscillator 10. Thus, each contact electrode 31 and each p-side electrode 17 can be connected accurately.

While the present invention has been described in connection with the preferred embodiment thereof, it will be understood that it is not intended to limit the invention to that embodiment and can be modified differently. For example, the embodiment specifically describes a semiconductor laser with four laser oscillators 10 on the same substrate 11. However, the present invention can be applicable widely irrespective of the number of the laser oscillator 10.

Also, in the preferred embodiment, the position of each opening 21 on the insulating film 20 is determined depending on each area divided in a grid by each line X drawn between each laser oscillator 10 in-parallel with the resonator direction A on the surface parallel with the substrate 11 and by each line Y drawn vertically to the resonator direction A in the center of each laser oscillator 10. However, the number of line Y drawn vertically to the resonator direction A can be plural depending on the number of laser oscillator 10.

In other words, each opening 21 can be formed within each of the areas divided in a grid which aligns in a slanting direction or aligns longitudinally or laterally with more than one area of space in between the areas each opening is positioned, in accordance with each of the laser oscillator 10 irrespective of the number of the laser oscillator 10. To be more specific, each opening 21 corresponding to each laser oscillator 10 placed side by side must be placed within each area placed in a slanting direction mutually among each area divided in a grid. The slanting direction refers to a direction other than longitudinal and lateral directions, and angle is not related.

In addition, although in the above-mentioned embodiment, each of contact electrodes 31 is extended respectively in parallel with the alignment direction B corresponding to each of the openings 21, the extention may be done vertical to the alignment direction B. Furthermore, each of contact electrodoes may be fromed according to the form of each of the openings 21.

In addition, in the above-mentioned embodiment, successive insulating layers 20 are formed between each p-side electrode 17 and each contact electrode 31. However, each of insulating layers 20 may be formed separately between each p-side electrode 17 and each contact electrode 31 making correspondence with each p-side electrode 17.

Furthermore, in the above-mentioned embodiment, materials composing each laser oscillator 10 are described specifically with examples. However, it is also applicable when each laser oscillator 10 is composed of other materials. For example, the embodiment is also applicable to the clad layer composed of InP and the active layer composed of InGaAs. Alternatively, it is also applicable to each clad layer composed of AlGaInP and the active layer composed of GaInP.

Still further, the above-mentioned embodiment describes the construction of each laser oscillator 10 by referring one example. However, each laser oscillator 10 having other constructions may also be applied in the same manner. For example, it is applicable to the one with a guide layer or the one with a substrate on which a p-type clad layer, an active layer and an n-type clad layer are laminated sequentially. Therefore, although the p-side electrode 17 is connected to the contact electrode 31 in the above-mentioned embodiment, the present invention is also applicable in the same manner when a contact electrode is connected to an n-side electrode.

Also, the preferred embodiment describes the case in which each p-side electrode 17 of each laser oscillator 10 is connected to each contact electrode 31 formed on the base substrate 32. However, the present invention is also applicable to the one in which each semiconductor layer, each electrode and each contact electrode are laminated sequentially on a substrate.

Still further, the above-mentioned embodiment specifically describes the semiconductor laser with laser oscillator 10 as a photoelectric conversion portion. However, the present invention is widely applicable to a photoelectric conversion element with other photoelectric conversion portion which converts photo energy to electric energy or vise versa. For example, it is applicable to other semiconductor light emitting elements such as light emitting diode, LED or semiconductor light receptive element such as a photodetector.

In addition, the above-mentioned embodiment specifically describes the case in which the MOCVD method is used for laminating a semiconductor layers on the substrate 11. However, other method such as the Molecular Beam Epitaxy; MBE, method can be used. Furthermore, although the preferred embodiment specifically described the case in which the RIE method is used for selectively removing a semiconductor layer with p-side electrode 17 as a mask, other dry etching or wet etching can be used.

As described above, according to a photoelectric conversion element and the method of manufacturing the same according to the invention, an insulating layer is equipped between an electrode of a photoelectric portion and a contact electrode, and, the electrode and the contact electrode are connected electrically through the opening. Thus, highly accurate position matching is not required between the electrode of the photoelectric conversion portion and the contact electrode, and they can be connected easily and accurately. Furthermore, mass production of the laser diode will be possible.

Particularly, according to the other photoelectric conversion element and the method of manufacturing the same, a position matching portion is provided for connecting the electrode of the photoelectric conversion portion and the contact electrode. By using the position matching portion, the position of the electrode of the photoelectric conversion portion and the contact electrode can be matched easily and accurately so that they can be connected easily and accurately.

In addition, according to the other photoelectric conversion element and the method of manufacturing the same, a part of a substrate side position matching portion is fixed to the contact electrode. Thus, connection between a laser oscillator and the contact electrode is supplemented and, furthermore, the laser oscillator can be supported supplementary.

Also, according to the other photoelectric conversion element and the method of manufacturing the same, as a metallic layer is formed on the substrate side position matching portion, by connecting the metallic layer and the contact electrode, the connection between laser oscillator and the contact electrode can be supported more strongly.

According to the other method of manufacturing a photoelectric conversion element, after a semiconductor layer is equipped with an electrode, it is removed selectively by using the electrode as a mask so that the photoelectric conversion portion can be formed accurately through fewer process. Accordingly simpler manufacturing processes and a decrease in the production cost can be achieved. Also, it enhances the accuracy of position matching between the photoelectric conversion portion and the contact electrode, and also the electrode and the contact electrode can be connected accurately.

What is claimed is:

1. A method of manufacturing a photoelectric element comprising the steps of:

forming a photoelectric conversion portion having a semiconductor layer equipped on a substrate and an electrode equipped on the semiconductor layer;

forming an insulating layer having an opening for the electrode of the photoelectric conversion portion;

forming a contact electrode electrically connected to the electrode of the photoelectric conversion portion through the opening of the insulating layer;

forming the electrode on the semiconductor layer; and removing the semiconductor layer selectively by using the electrode as a mask.

2. A method for manufacturing a photoelectric conversion element, comprising the steps of:

forming a photoelectric conversion portion having a semiconductor layer equipped on a substrate and an electrode equipped on the semiconductor layer;

forming an insulating layer having an opening for the electrode of the photoelectric conversion portion;

forming a contact electrode electrically connected to the electrode of the photoelectric conversion portion through the opening of the insulating layer;

forming a plurality of the photoelectric conversion portion on the same substrate;

forming a plurality of openings at the insulating layer corresponding to each photoelectric conversion portion, wherein the each opening is positioned within each area which aligns in a slanting direction or aligns longitudinally or laterally with more than one area of space in between the areas the openings are positioned, and forming a plurality of contact electrodes, respectively, corresponding to each photoelectric conversion portion.

3. A method for manufacturing a photoelectric conversion element comprising steps of:

forming a photoelectric conversion portion having a semiconductor layer equipped on a substrate and an electrode equipped on the semiconductor layer;

forming an insulating layer having an opening for the electrode of the photoelectric conversion portion;

forming a contact electrode electrically connected to the electrode of the photoelectric conversion portion through the opening of the insulating layer;

forming a position matching portion for connecting an electrode of the photoelectric conversion portion and the contact electrode; and connecting the contact electrode to the electrode of the photoelectric conversion portion electrically by using the position matching portion.

4. A method for manufacturing a photoelectric conversion element comprising the steps of:

forming a photoelectric conversion portion having a semiconductor layer equipped on a substrate and an electrode equipped on the semiconductor layer;

forming an insulating layer having an opening for the electrode of the photoelectric conversion portion;

forming a contact electrode electrically connected to the electrode of the photoelectric conversion portion through the opening of the insulating layer;

forming a substrate side position matching portion having a metallic layer; and connecting the metallic layer to the contact electrode.

5. A method for manufacturing a photoelectric conversion element comprising the steps of:

forming a photoelectric conversion portion having a semiconductor layer equipped on a substrate and an electrode equipped on the semiconductor layer;

forming an insulating layer having an opening for the electrode of the photoelectric conversion portion; and forming a contact electrode electrically connected to the electrode of the photoelectric conversion portion through the opening of the insulating layer;

forming the contact electrode on a base, and connecting the contact electrode to the electrode of the photoelectric conversion portion electrically.

6. A method of manufacturing a photoelectric element, comprising the steps of:

forming a photoelectric conversion portion having a semiconductor layer equipped on a substrate and an electrode equipped on the semiconductor layer;

forming an insulating layer having an opening for the electrode of the photoelectric conversion portion;

forming a contact electrode electrically connected to the electrode of the photoelectric conversion portion through the opening of the insulating layer;

forming the electrode on the semiconductor layer;

removing the semiconductor layer selectively by using the electrode as a mask;

forming a plurality of the photoelectric conversion portion on the same substrate;

forming a plurality of openings at the insulating layer corresponding to each photoelectric conversion portion, wherein the each opening is positioned within each area which aligns in a slanting direction or aligns longitudinally or laterally with more than one area of space in between the areas the openings are positioned;

forming a plurality of contact electrodes, respectively, corresponding to each photoelectric conversion portion;

forming a position matching portion for connecting the electrode of the photoelectric conversion portion and the contact electrode;

connecting the contact electrode to the electrode of the photoelectric conversion portion electrically by using the position matching portion;

forming a substrate side position matching portion having a metallic layer;

connecting the metallic layer to the contact electrode;

forming the contact electrode on a base; and connecting the contact electrode to the electrode of the photoelectric conversion portion electrically.

7. The method of manufacturing the photoelectric element of claim 1, comprising the steps of:

forming a position matching portion for connecting an electrode of the photoelectric conversion portion and the contact electrode;

connecting the contact electrode to the electrode of the photoelectric conversion portion electrically by using the position matching portion;

forming a plurality of the photoelectric conversion portion on the same substrate;

forming a plurality of openings at the insulating layer corresponding to each photoelectric conversion portion, wherein the each opening is positioned within each area which aligns in a slanting direction or aligns longitudinally or laterally with more than one area of space in between the areas the openings are positioned, and forming a plurality of contact electrodes, respectively, corresponding to each photoelectric conversion portion.

8. The method of manufacturing the photoelectric element of claim 7, further comprising the steps of:

forming a substrate side position matching portion having a metallic layer;

connecting the metallic layer to the contact electrode;

forming the contact electrode on a base, and connecting the contact electrode to an electrode of the photoelectric conversion portion electrically.

9. The method of manufacturing a photoelectric conversion element of claim 4, further comprising the steps of:

forming a position matching portion for connecting an electrode of the photoelectric conversion portion and the contact electrode; and connecting the contact electrode to the electrode of the photoelectric conversion portion electrically by using the position matching portion.

10. The method of manufacturing a photoelectric conversion element of claim 7, further comprising the steps of:

forming the substrate side position matching portion having a metallic layer, and connecting the metallic layer to the contact electrode.

11. The method of manufacturing a photoelectric conversion element of claim 7, further comprising the steps of:

forming the contact electrode on a base, and connecting the contact electrode to the electrode of the photoelectric conversion portion electrically.

12. The method of manufacturing a photoelectric conversion element of claim 5, further comprising the steps of:

forming a position matching portion for connecting an electrode of the photoelectric conversion portion and the contact electrode; and connecting the contact electrode to the electrode of the photoelectric conversion portion electrically by using the position matching portion.

13. The method of manufacturing a photoelectric conversion element of claim 5, further comprising the steps of:

forming the substrate side position matching portion having a metallic layer, and connecting the metallic layer to the contact electrode.

14. The method of manufacturing a photoelectric conversion element of claim 4, further comprising the steps of:

forming the contact electrode on a base, and connecting the contact electrode to the electrode of the photoelectric conversion portion electrically.

15. The method of manufacturing a photoelectric conversion element of claim 5, further comprising the steps of:

forming the substrate side position matching portion having a metallic layer, and connecting the metallic layer to the contact electrode.

* * * * *